(12) United States Patent
Okubo et al.

(10) Patent No.: US 6,853,208 B2
(45) Date of Patent: Feb. 8, 2005

(54) VERTICAL PROBE CARD

(75) Inventors: Masao Okubo, Nishinomiya (JP); Kazumasa Okubo, Kanagawa-ken (JP); Hiroshi Iwata, Kyoto-fu (JP)

(73) Assignee: Nihon Denshizairyo Kabushiki Kaisha, Amagasaki (JP)

( * ) Notice: Subject to any disclaimer, the term of this patent is extended or adjusted under 35 U.S.C. 154(b) by 0 days.

(21) Appl. No.: 09/851,946

(22) Filed: May 10, 2001

(65) Prior Publication Data

US 2002/0041189 A1 Apr. 11, 2002

(30) Foreign Application Priority Data

Aug. 9, 2000 (JP) ........................................ 2000-241903

(51) Int. Cl.⁷ .............................................. G01R 31/02
(52) U.S. Cl. ...................... 324/758; 324/754; 324/158.1
(58) Field of Search ................................ 324/765, 754, 324/158.1, 758, 755, 72.5, 757, 761; 438/14, 17, 18; 439/700, 482

(56) References Cited

U.S. PATENT DOCUMENTS

| | | | | |
|---|---|---|---|---|
| 4,931,726 A | * | 6/1990 | Kasukabe et al. | 324/754 |
| 5,128,612 A | * | 7/1992 | Aton et al. | 324/754 |
| 5,187,431 A | * | 2/1993 | Libretti | 324/754 |
| 5,325,052 A | * | 6/1994 | Yamashita | 324/754 |
| 5,525,911 A | * | 6/1996 | Marumo et al. | 324/754 |
| 5,952,843 A | * | 9/1999 | Vinh | 324/761 |
| 5,977,787 A | * | 11/1999 | Das et al. | 324/758 |
| 6,297,657 B1 | * | 10/2001 | Thiessen et al. | 324/761 |

* cited by examiner

Primary Examiner—Evan Pert
Assistant Examiner—Jimmy Nguyen
(74) Attorney, Agent, or Firm—Armstrong, Kratz, Quintos, Hanson & Brooks, LLP

(57) ABSTRACT

Purpose: To present a vertical probe card capable of reusing without replacing a broken probe if a probe is broken. Constitution: A vertical probe card having vertical probes 100, being used in measurement of electric characteristics of an LSI chip 610 to be measured, comprising a main substrate 300 forming conductive patterns 310, a plurality of probes 100 drooping vertically from the main substrate 300, and a probe support 200 provided at the back side of the main substrate 300 for supporting the probes 100, in which the probe support 200 is disposed parallel to the main substrate 300, and has an upper guide plate 210 and a lower guide plate 220 for supporting the probes 100 by passing the through-holes 211,221 opened in each, and the lower guide plate 220 is composed of three substrates 220A, 220B, 220C laminated separately.

1 Claim, 5 Drawing Sheets

VERTICAL PROBE CARD

TECHNICAL FIELD

The present invention relates to a probe card for measuring semiconductor integrated circuits such as LSI, and more particularly to a vertical probe card having vertical probes.

Prior Art

Conventional probe cards are roughly classified into the lateral type also known as the cantilever type, and the vertical type. The cantilever type has many excellent performances, but as the LSI is becoming smaller in size and higher in speed and degree of integration and the measuring instruments are multiplexed, it is becoming harder to be applied in simultaneous measurement of a plurality.

Accordingly, attention has been drawn to the vertical type which can be applied in such uses. The vertical probe card comprises a main substrate composed of more than ten layers forming conductive patterns, a probe having a V-bend in the middle, and a probe support provided beneath the main substrate, and having an upper guide plate and a lower guide plate at both sides of the bend. The junction at the lower end of the probe is soldered to the conductive pattern of the surface by way of a through-hole opened in the main substrate. Through-holes for passing the probe are opened in the upper guide plate and lower guide plate. The two-dimensional configuration of the probe is designed corresponding to the layout of electrode pads of the LSI chip to be measured.

Such conventional vertical probe card, however, had the following problems.

First, in this kind of probe card, if the probe is broken, since the probe has a bend, it cannot be drawn out of the through-holes in the upper and lower guide plates. Some of the vertical probe cards are very expensive, using thousands or tens of thousands of probes. If a broken probe cannot be drawn out and replaced, it is a problem.

The invention is created in the light of the above circumstances, and it is hence an object thereof to present a vertical probe card capable of measuring the modern LSI chips smaller in size and higher in density and integration, and being reused, if a probe is broken, by replacing the broken probe.

SUMMARY OF THE INVENTION

The vertical probe card of the invention is a vertical probe card having vertical probes for use in measurement of electric characteristics of the objects of measurement, comprising a main substrate forming conductive patterns, a plurality of probes drooping vertically from the main substrate, and a probe support provided at the back side of the main substrate for supporting the probes, in which the probe support is disposed parallel to the main substrate, and has an upper guide plate and a lower guide plate for supporting the probes by passing the through-holes opened in each, and the lower guide plate is composed of a plurality of substrates laminated separably.

REFERENCE NUMERALS

100 Probe
110 Contact part
200 Probe support
210 Upper guide plate
220 Lower guide plate
220A, 220B, 220C Substrate
250 Drooping member
300 Main substrate

EMBODIMENT OF THE INVENTION

Figure 1:
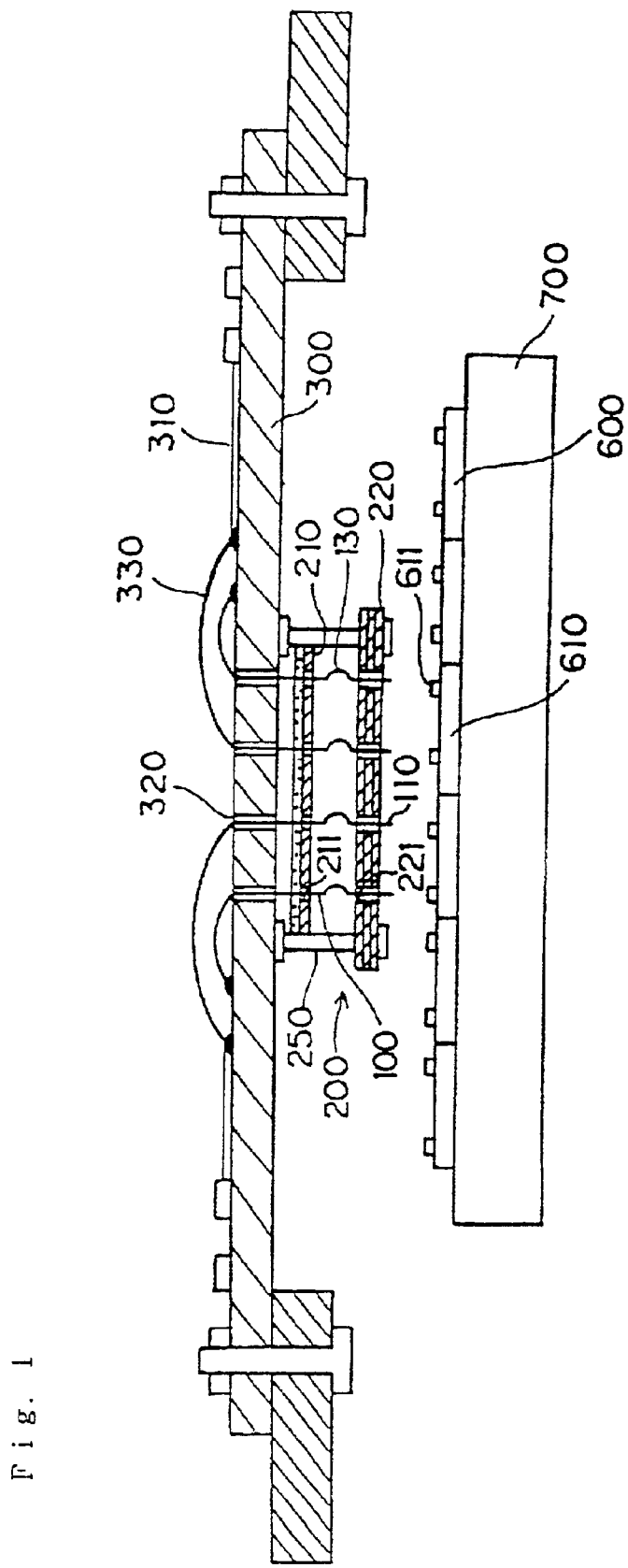
FIG. 1 is a schematic sectional view of a vertical probe according to an embodiment of the invention.

A probe card in an embodiment of the invention is a vertical probe card having vertical probes 100, being used in measurement of electric characteristics of an LSI chip 610 to be measured as shown in FIG. 1 and others, comprising a main substrate 300 forming conductive patterns 310, a plurality of probes 100 drooping vertically from the main substrate 300, and a probe support 200 provided at the back side of the main substrate 300 for supporting the probes 100, in which the probe support 200 is disposed parallel to the main substrate 300, and has an upper guide plate 210 and a lower guide plate 220 for supporting the probes 100 by passing the through-holes 211, 221 opened in each, and the lower guide plate 220 is composed of a plurality of (three in the drawing) substrates 220A, 220B, 220C laminated separably.

The main substrate 300 is a substrate forming conductive patterns 310 on the surface. Plural through-holes 320 are opened in this main substrate 300. The through-holes 320 correspond to the layout of electrode pads 611 of an LSI chip 610. The through-holes 320 are the portions in which the junctions at the rear ends of the probes 100 are inserted, and the inserted junctions are electrically connected to the conductive patterns 310 by thin wires 330.

At the back side of the main substrate 300, the probe support 200 is provided. The probe support 200 includes a drooping member 250 drooping from the back side of the main substrate 300, and the upper guide plate 210 and lower guide plate 220 attached to this drooping member 250 at a specific interval.

Through-holes 211 and 221 are opened in the upper guide plate 210 and lower guide plate 220 respectively. The through-holes 211, 221 correspond to the layout of electrode pads 611 of the LSI chip 610. Therefore, the through-hole 211 of the upper guide plate 210, and the corresponding through-hole 221 of the lower guide plate 220 and also the through-hole 320 of the main substrate 300 are positioned on a same vertical line. The probes 100 are fixed by an insulating synthetic resin 212 filling the upper surface of the upper guide plate 210, for example, silicone rubber, as shown in FIG. 2 and others.

Figure 2:
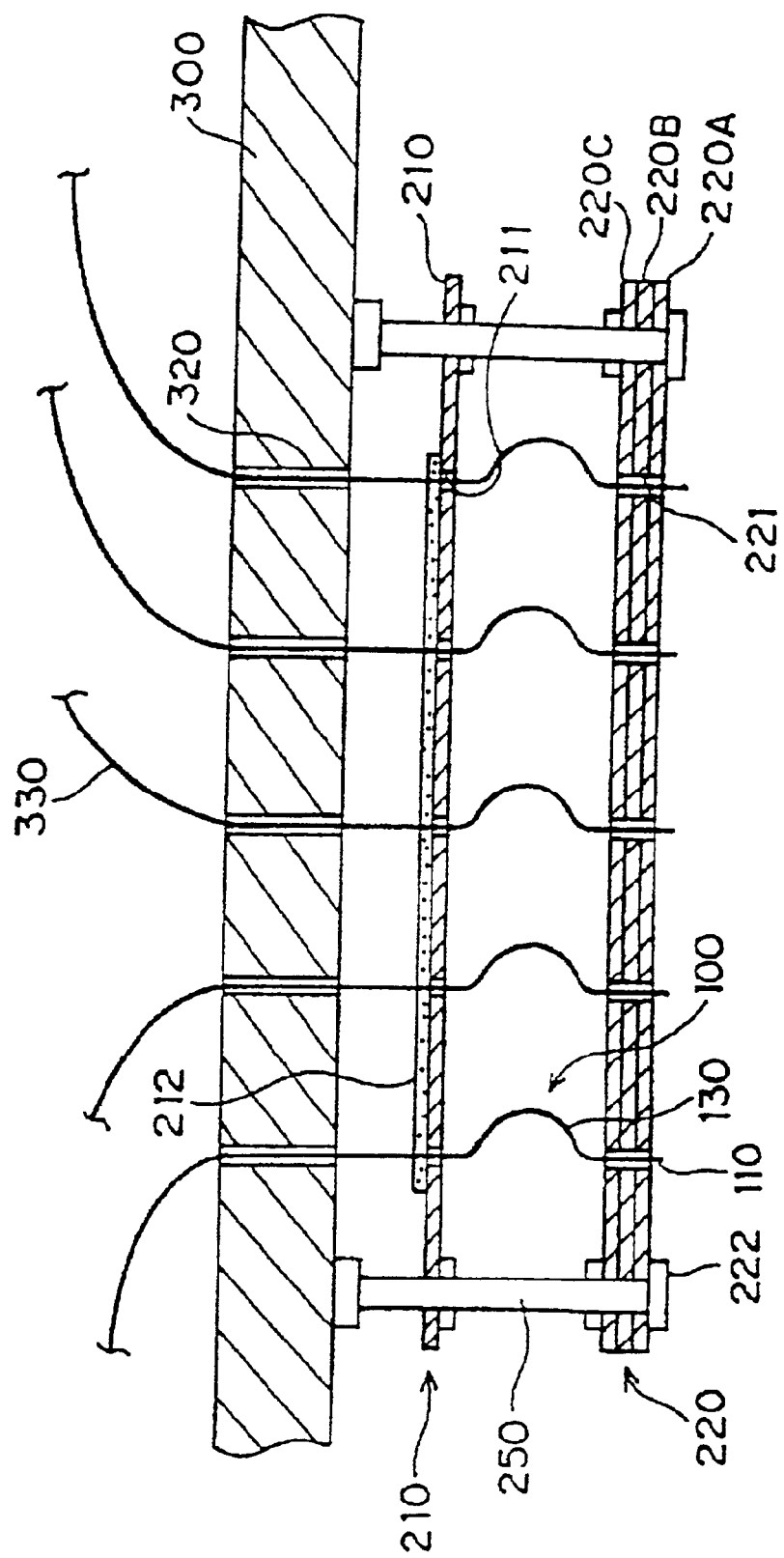
FIG. 2 is a schematic sectional view of essential parts of the probe card.

The lower guide plate 220 is, as shown in FIG. 2 and others, composed of three substrates 220A, 220B, 220C which are laminated separably. The three substrates 220A, 220B, 220C are laminated in a state fixed by bolts 222.

The probe 100 forms a pointed contact part 110 at the leading end, and also has a pointed junction at the rear end. The probe 100 is, for example, made of a processed tungsten thin wire, and is about 50 to 150 μm in diameter.

This probe 100 has a curved bend 130. The bend 130 is deflected at the time of overdrive as mentioned below, and elastically holds a specified contact pressure together with the electrode pad 611 of the LSI chip 610.

The probe card having such configuration measures the electric characteristics of the LSI chip 610 in the following manner.

Plural LSI chips 610 in wafer state are sucked in vacuum on the upper surface of the table 700. The probe card is lowered toward the table 700, and the contact parts 110 of all probes 100 are brought into contact with the electrode pads 611 of the LSI chip 610. Further, after the contact parts 110 contact with the electrode pads 611, the probe card is lowered in order to maintain a specified contact pressure (overdrive).

Figure 3:
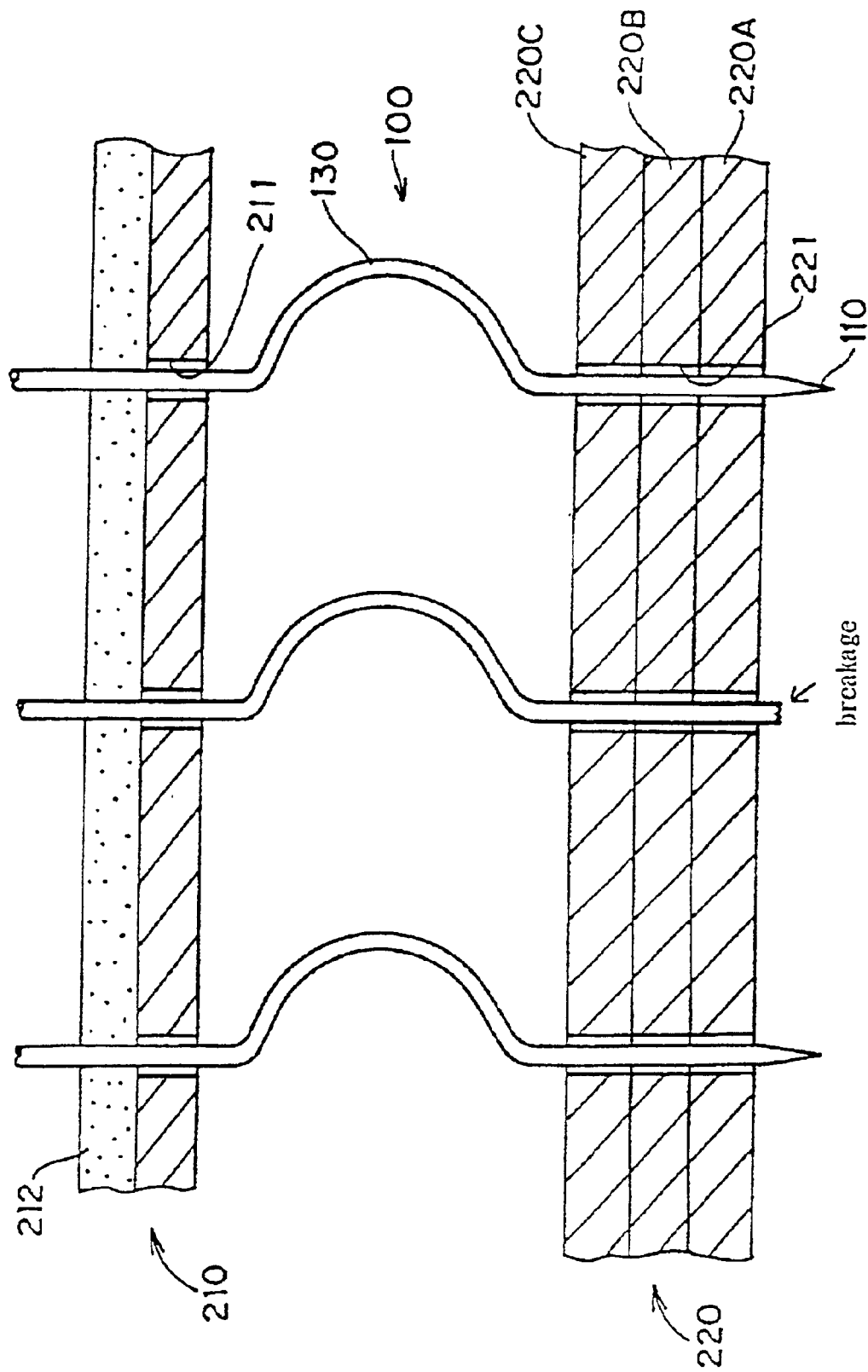
FIG. 3 is a schematic sectional view of essential parts showing a broken state of one probe in the probe card.
Figure 4:
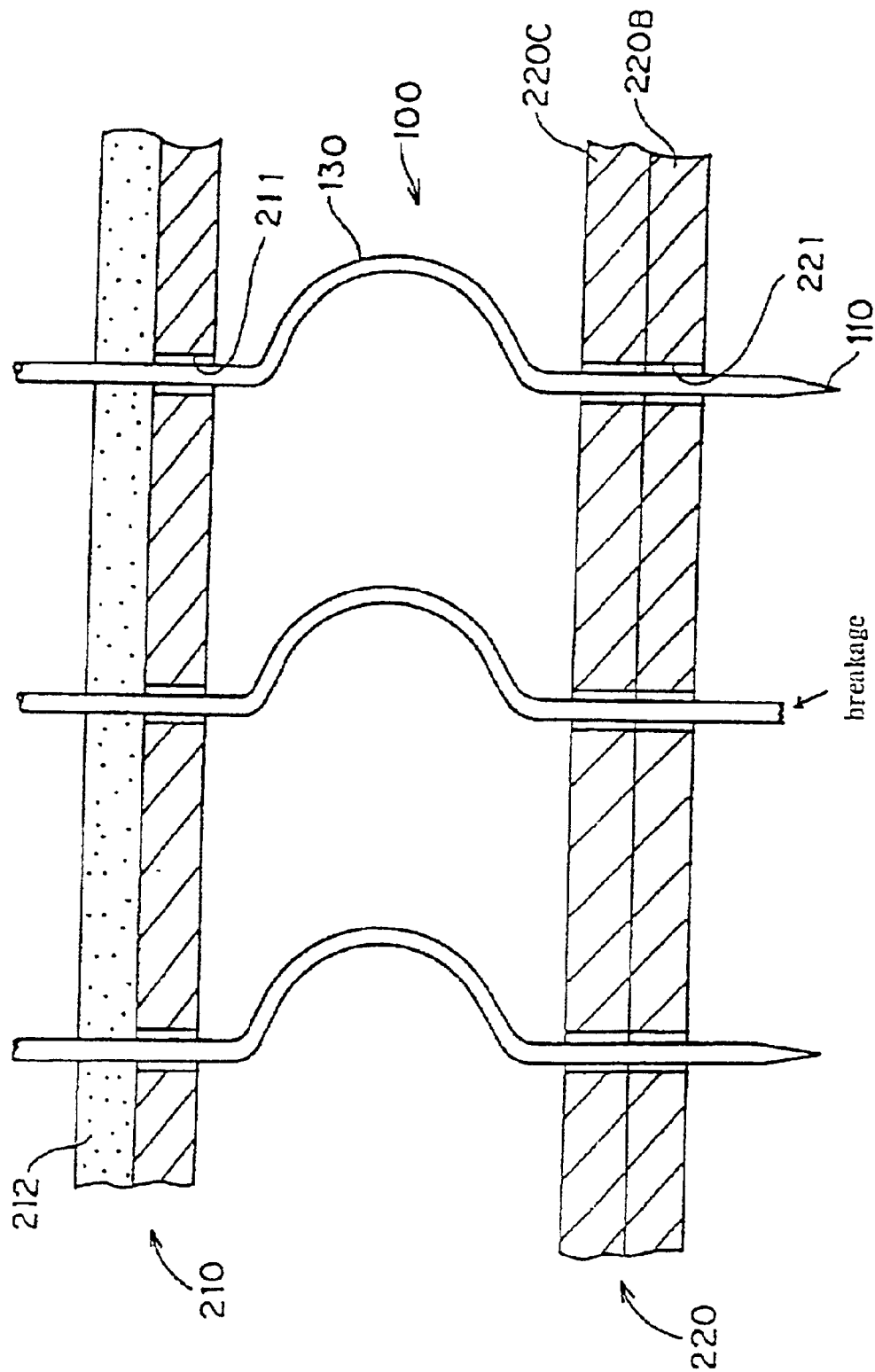
FIG. 4 is a schematic sectional view of essential parts showing a restoring process in the case of breakage of one probe in the probe card.
Figure 5:
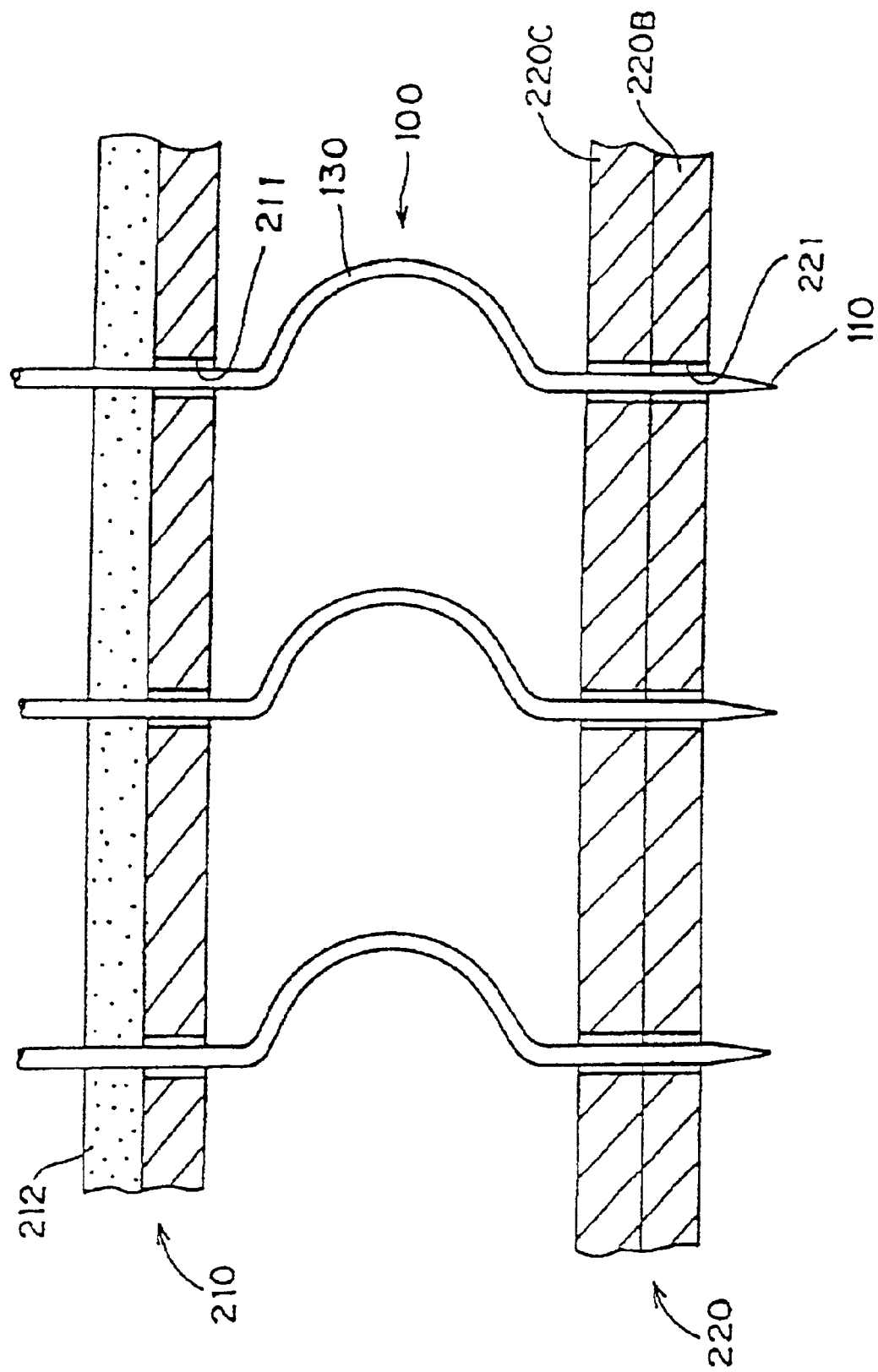
FIG. 5 is a schematic sectional view of essential parts of a completion state of restoration in the case of breakage of one probe in the probe card.

Suppose one probe 100 is broken. Most breakage accidents of probe 100 are breakage of the leading end contact pat 110 as shown in FIG. 3. That is, the broken probe 100 is shortened in length, and is not suited to contact with the electrode pad 611. In such a case, the substrate 220A of the lowest side of the lower guide plate 220 is peeled. As a result, most intact probes 110 project further by the thickness portion of the substrate 220A separated from the lower guide plate 220. On the other hand, the probe 100 of which leading end contact part 110 is broken is polished in the leading end, and is projected again sufficiently to work as contact part 110.

For peeling the substrate 220A at the lowest side, the bolts 222 for fixing the three substrates 220A, 220B, 220C for composing the lower guide plate 220 are loosened.

Herein, all probes 100 are polished. The polishing process consists of two steps, that is, flattening for aligning the length of all probes 100, and sharpening for forming sharp contact parts 110 at the leading ends of all probes 100 aligned in length.

After two steps of flattening and sharpening, the polished probes 100 are shorter by the polished portion, but since all contact parts 110 are aligned on a same plane, they can be reused.

If the lower guide plate 220 is composed of three substrates 220A, 220B, 220C, two sessions of polishing are possible.

In the embodiment, the lower guide plate 220 is composed of three substrates 220A, 220B, 220C, but it may be also composed of two or four or more substrates.

EFFECTS OF THE INVENTION

The vertical probe card of the invention is a vertical probe card having vertical probes for use in measurement of electric characteristics of the objects of measurement, comprising a main substrate forming conductive patterns, a plurality of probes drooping vertically from the main substrate, and a probe support provided at the back side of the main substrate for supporting the probes, in which the probe support is disposed parallel to the main substrate, and has an upper guide plate and a lower guide plate for supporting the probes by passing the through-holes opened in each, and the lower guide plate is composed of a plurality of substrates laminated separably.

Accordingly, if the leading end of a probe is broken, the lowest substrate of the lower guide plate is separated, and all probes are polished and the contact parts of all probes are aligned on a same plane, so that the vertical probe card can be reused without replacing the broken probe.

What is claimed is:

1. A vertical probe card having vertical probes for use in measurement of electric characteristics of the objects of measurement, comprising a main substrate forming conductive patterns, a plurality of probes drooping vertically from said main substrate, and a probe support provided at the back side of said main substrate for supporting said probes, wherein said probe support is disposed parallel to said main substrate, and has an upper guide plate and a lower guide plate for supporting the probes by passing the through-holes opened in each, and said lower guide plate is composed of a plurality of substrates laminated separably.

* * * * *